United States Patent [19]

Garbe et al.

[11] Patent Number: 4,931,720
[45] Date of Patent: Jun. 5, 1990

[54] ARRANGEMENT FOR MEASURING TRANSFER IMPEDANCES OF COAXIAL CABLES

[75] Inventors: Heyno Garbe, Baden; Diethard Hansen, Berikon, both of Switzerland

[73] Assignee: Asea Brown Boveri Ltd., Baden, Switzerland

[21] Appl. No.: 350,204

[22] Filed: May 11, 1989

[30] Foreign Application Priority Data

May 18, 1988 [CH] Switzerland .................. 1878/88

[51] Int. Cl.⁵ ............................................. G01R 27/00
[52] U.S. Cl. .................................... 324/627; 324/615; 324/641
[58] Field of Search .............. 324/57 R, 58 A, 58.5 A, 324/475, 58 R

[56] References Cited

U.S. PATENT DOCUMENTS

| | | | |
|---|---|---|---|
| 3,952,245 | 4/1976 | Miller | 324/57 R |
| 4,425,542 | 1/1984 | Tasaliovich et al. | 324/58 R |
| 4,647,844 | 3/1987 | Biegon et al. | 324/57 R |
| 4,814,713 | 3/1989 | Van Brunt et al. | 324/58.5 A X |

FOREIGN PATENT DOCUMENTS

1490421 11/1977 United Kingdom.

OTHER PUBLICATIONS

Brooks et al., A Time Domain Crosswalk Test for Coaxial Cables, Proceedings of the 28th Int. Wire & Cable Symp. Cherry Hill, N.J., USA, 13–15 Nov. 1979, pp. 58–64.

Toute L'Electronique, No. 454 (May 1980), Paris (FR), pp. 63–67. "Etudes des influences exterieures sur les liaisons coaxiales".

*Primary Examiner*—Reinhard J. Eisenzopf
*Assistant Examiner*—Jack B. Harvey
*Attorney, Agent, or Firm*—Oblon, Spivak, McClelland, Maier & Neustadt

[57] ABSTRACT

In an arrangement for measuring transfer impedances of coaxial systems (3), a generator (1) is connected via a coaxial, supplying system (2) to a conductor shield (6) of the coaxial system (3) at a first end of the coaxial system (3). A voltage measuring instrument is connected to the first end between the conductor shield (6) and the inner conductor (5) of the coaxial system (3). The electrical contact between the supplying system (2) and the conductor shield (6) is created by a gripping collet (12). The conductor shield (6) and the inner conductor (5) are short-circuited at a second end of the coaxial system (3).

7 Claims, 3 Drawing Sheets

ARRANGEMENT FOR MEASURING TRANSFER IMPEDANCES OF COAXIAL CABLES

BACKGROUND OF THE INVENTION

1. Field of the Invention

The invention relates to an arrangement for measuring transfer impedances of coaxial systems, comprising a generator, which is connected via a coaxial, supplying system to a conductor shield of the coaxial system at a first end of the coaxial system, and a voltage measuring instrument, which is connected at the first end between the conductor shield and the inner conductor of the coaxial system.

2. Discussion of Background

With reference to the design of systems which do justice to the requirements of electromagnetic compatibility (EMC) it is important to be able to forecast the coupling behavior of transient, non-sinusoidal signals in electrical conductors, especially in shielded coaxial cables. Apart from the amplitude, the phase of the transfer impedance must also be known. The Standard IEC-96-1A indicates a method to be used in measuring the amplitude of the transfer impedance in the frequency range. However, the directions for carrying out the method are capable of being properly effected only for frequencies which are not too high (up to approximately 30 MHz). Accordingly, to date measurements have been limited to this frequency range, in the main.

With this Standard, a problem is represented by the required soldered connection between the supplying system and the cable shield. In practice, it is found that it is difficult to create a good soldered connection, without damaging the cable dielectric, or altering the conductor shield (an attrition of tin-lead solder through the braided screen). A further problem is represented by the required matched cable head. Firstly, resistors are frequency-dependent, i.e. the matching occurs only in a definite frequency range), and secondly, during assembly there is often a gap between the resistor and the cable, which leads to an inhomogeneous cable section. This is especially to be avoided for the higher frequency range, since the correction formula given by the upper Standard presupposes a homogeneous cable section. For the same reason, it is also important that the cable runs coaxially, which, however, cannot be observed without difficulty for the Standard IEC-96-1A.

All the described disadvantages of the prior art entail that measurements have mainly been restricted to a frequency range in which the cable can be considered small as compared with the wavelength.

SUMMARY OF THE INVENTION

Accordingly, one object of this invention is to provide a novel arrangement for measuring transfer impedances of coaxial systems, comprising a generator, which is connected via a coaxial, supplying system to a conductor shield of the coaxial system at a first end of the coaxial system, and a voltage measuring instrument, which is connected at the first end between the conductor shield and the inner conductor of the coaxial system, which is simple, i.e. delivers reproducable results for low expenditure, and, especially, can also be used without difficulty for higher frequencies.

According to the invention, the object is achieved that the electrical contact between the supplying system and the conductor shield is created by a gripping collet, and in that the conductor shield and the inner conductor are short-circuited at a second end of the coaxial system.

In a preferred embodiment, the supplying system is a conduit, which has a threaded cap at one end, in which cap the gripping collet is fixed. The conduit has a constant inner diameter over the entire length. It is especially practical if the conduit is sealed at both ends with a threaded cap.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 shows a cross-section through a gripping collet with a coaxial cable clamped in;

DESCRIPTION OF THE PREFERRED EMBODIMENTS

Figure 1:
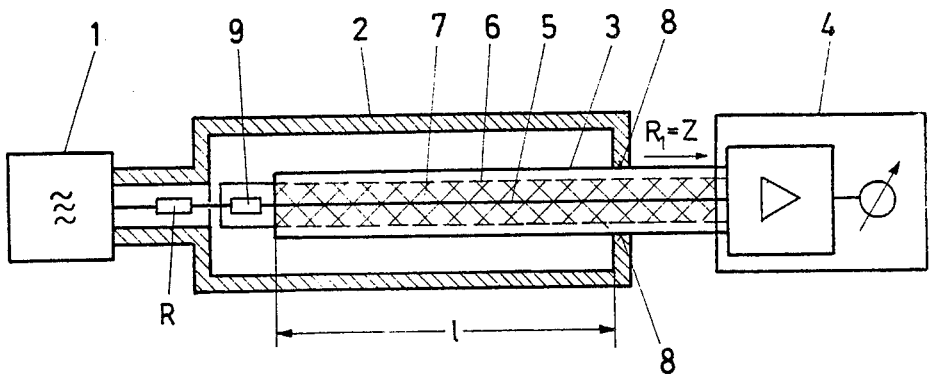
FIG. 1 shows a measuring arrangement according to the Standard IEC-96-1A.

To gain a better understanding, the arrangement of the Standard IEC-96-1A will first be briefly discussed again. Referring now to the drawings, wherein like reference numerals designate identical or corresponding parts throughout the several views, in FIG. 1 there is shown the arrangement for measuring transfer impedances. An examination is made of a coaxial system 3, e.g. a shielded cable. It comprises a coaxial inner conductor 5, a conductor shield 6 and a dielectric 7, which isolates conductor shield 6 and inner conductor 5.

A generator 1 is soldered (soldered point 8) via a coaxial, supplying system 2 to a first end of the coaxial system 3 at the conductor shield 6. At a second end, the inner conductor 5 is sealed with a matched resistor 9, and then connected to the conductor shield 6. This sealed second end is connected via a resistor to the generator 1.

At the first end, a voltage measuring instrument 4 measures the amplitudes between the conductor shield 6 and the inner conductor 5.

Figure 2:
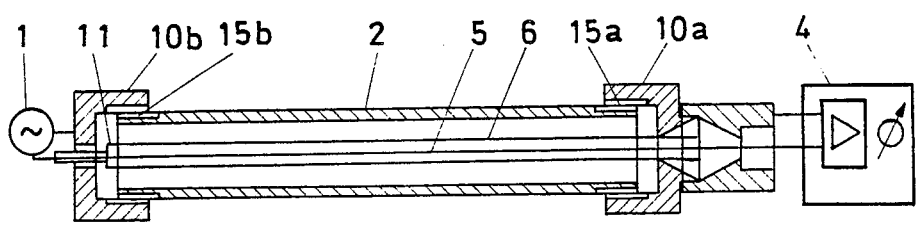
FIG. 2 shows an arrangement according to the invention for measuring the amplitude and phase of transfer impedances.

FIG. 2 shows a preferred embodiment of the invention. In FIG. 2, the parts corresponding to those of FIG. 1 are provided with the same reference symbols.

According to a preferred embodiment, the supplying system 2 is a conduit with a constant inner diameter, which is sealed at its ends with a threaded cap 10a, 10b, respectively.

The matched resistor 9 (FIG. 1) is replaced, according to the invention by a short-circuit 11 (FIG. 2).

The threaded cap 10a comprises a gripping collet 12, which creates the required good contact between the supplying system 2 and the conductor shield 6.

Figure 3:
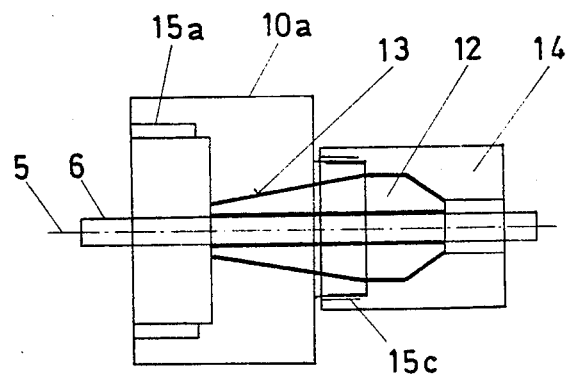
FIG. 3 shows a threaded cap with a gripping collet.

FIG. 3 shows, once again, the threaded cap 10a. It is screwed onto the supplying system with a first thread 15a. It is provided with an axial, conical bore 13, into which the gripping collet 12 is pressed through an attachment 14. For this purpose, the threaded cap 10a is provided, e.g., with a second thread 15b, in which the attachment 14 is firmly screwed.

The first thread 15a is there in order to tension the coaxial system 3 (e.g. a coaxial cable). In this connection, it is also advantageous to place a threaded cap 10b on the other end of the supplying system 2.

Figure 4:
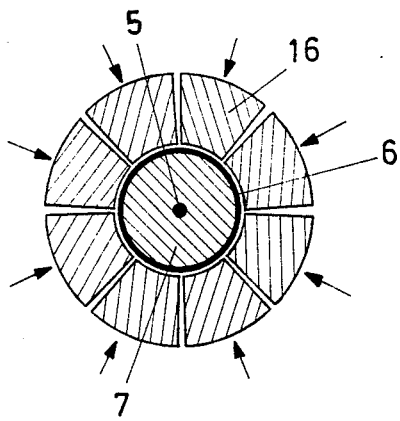

FIG. 4 shows a cross-section through a gripping collet 12. It consists essentially of a number of segments 16, which are loosely joined to one another. The coaxial system with the inner conductor 5, the dielectric 7 and the connector shield 6 is introduced in the middle. (An oversheath surrounding the conductor shield has been removed in advance). When the attachment 14 is screwed firmly onto the threaded cap 10a, the gripping collet 12 is pressed in the radial direction (see arrows in FIG. 4) onto the conductor shield 5. In this way, a good contact is assured without the dielectric 7 being damaged, or the conductor shield 6 being influenced.

To produce an optimum electrical contact, the gripping collet 12 and the threaded cap 10a are preferably gilded.

A great advantage of the arrangement with the gripping collet also lies in the fact that the cable can be exchanged rapidly and easily.

In order for the conductor shield 6 to form a homogeneous cable with the supplying system 2, the coaxial system 3 must lie precisely on an axis of the supplying system. This is achieved with the threaded caps 10a, 10b, with which the coaxial cable can be tensioned.

As already mentioned, the matched resistor 9, is replaced by a short-circuit 11. The latter is not subject to the problem already mentioned. The evaluation of the measurements results is also not rendered difficult thereby. As is known, even with the method according to IEC-96-1A, the measured values must still be connected by a correlation function for the high frequency range (>30 MHz), in order to obtain the frequency response. With the arrangement according to the invention, the correlation function is then simply altered.

Moreover, the short-circuit 11 has the advantage that the range of measurement is enhanced by up to 6 dB. The fact that the improvements of the Standard IEC-96-1A according to the invention really do have the hoped-for effects, can be shown with reference to a laboratory measurement.

Figure 5:
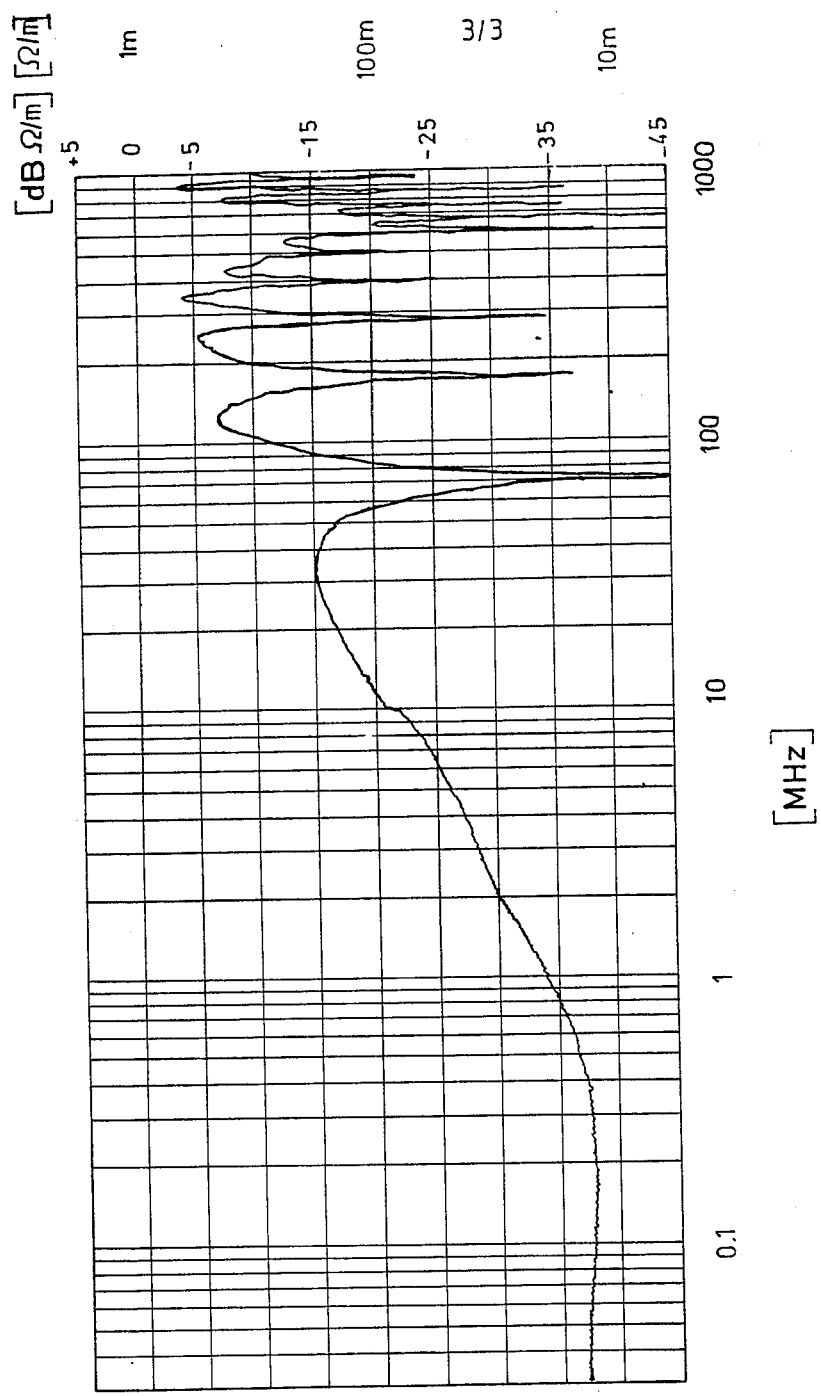
FIG. 5 shows a measured frequency response of a cable (RG 58 C/U)

FIG. 5 shows a measurement on a cable (here RG 58 C/U). Plotted on the abscissa is the frequency in MHz, and on the ordinate the measured value in dB $\Omega$/m. The measurement is partially compensated, i.e. the constant portion of $-33$ dBV has already been subtracted from the measured values, in order to illustrate the agreement with previous measurements.

Figure 6:
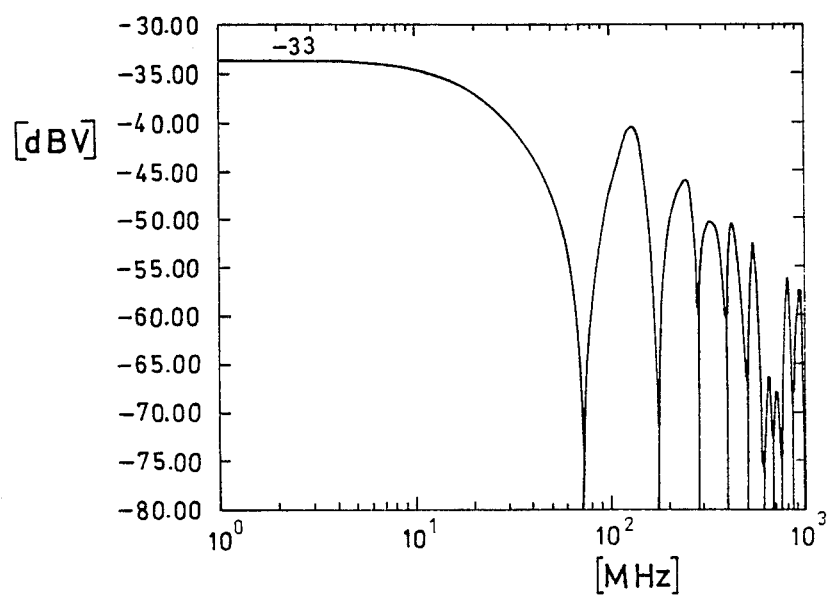
FIG. 6 shows a correlation curve of the arrangement according to the invention.

FIG. 6 shows a correlation function. It is determined by computation from the wave impedances and the propagation constants of the arrangement, and is to be subtracted from the measured values, in order to obtain the desired transfer impedance $Z_T$.

It is known from theory that the transfer impedance for low frequencies (diffusion coupling) is constant, and for higher frequencies (aperture coupling) is proportional to the frequency. For the measurement of FIG. 5 and the correlation function of FIG. 6, this means that zero positions in the measurement may occur only at the same time as zero positions in the correlation function. This is indeed the case, (e.g. first zero position at slightly more than 70 MHz, second zero position at slightly less than 200 MHz etc.). If, now, the correlation function is subtracted from the measurement, the zero positions compensate one another.

Thus, when measuring with the arrangement according to the invention, a correction similar to that for the Standard IEC-96-1A can be carried out. Further, because of the high measurement accuracy with the arrangement according to the invention, it is possible to determine the transfer impedance in complex form.

It may be said in summary that by using the invention it is possible to make statements about transient interferences in cable systems.

Obviously, numerous modifications and variations of the present invention are possible in the light of the above teachings. It is therefore to be understood that within the scope of the appended claims, the invention may be practised otherwise than as specifically described herein.

What is claimed as new and desired to be secured by Letters Patent of the United States is:

1. Arrangement for measuring transfer impedances of coaxial cables at higher frequencies, preferably beyond 30 MHz and up to 1 GHz, comprising:
   a generator, which is connected via a coaxial supplying system to a conductor shield of a coaxial cable at a first end of the coaxial cable, and
   a voltage measuring instrument which is connected at the first end between the conductor shield and the inner conductor of the coaxial cable,
   wherein;
   the electrical contact between the supplying system and the conductor shield is created by a gripping collet, and
   the conductor shield and the inner conductor are short circuited at a second end of the coaxial cable.

2. Arrangement for measuring transfer impedances of coaxial cables at higher frequencies, preferably beyond 30 MHz and up to 1 GHz, comprising:
   a generator, which is connected via a coaxial supplying system to a conductor shield of a coaxial cable at a first end of the coaxial cable, and
   a voltage measuring instrument which is connected at the first end between the conductor shield and the inner conductor of the coaxial cable,
   wherein:
   the electrical contact between the supplying system and the conductor shield is created by a gripping collet,
   the supplying system comprises a conduit which has a threaded cap, said threaded cap comprising the gripping collet and exhibiting a thread in order to tension the coaxial cable, and wherein the conductor shield and the inner conductor are short circuited at a second end of the coaxial cable.

3. The arrangement as claimed in claim 2, wherein:
   the gripping collet consists essentially of a number of segments which are loosely joined to one another,
   the coaxial cable is introduced in the middle of the gripping collet, and
   the gripping collet is pressed in the radial direction onto the conductor shield.

4. The arrangement as claimed in claim 2, wherein the threaded cap is provided with a coaxial, conical bore into which the gripping collet is pressed by an attachment.

5. The arrangement as claimed in claim 2, wherein the conduit is provided at both ends with a threaded cap.

6. The arrangement as claimed in claim 2, wherein the supplying system is a conduit with a constant inner diameter.

7. The arrangement as claimed in claim 2, wherein the gripping collet and the threaded cap are gilded.

* * * * *